(12) United States Patent
Alharbi et al.

(10) Patent No.: US 8,394,224 B2
(45) Date of Patent: Mar. 12, 2013

(54) METHOD OF FORMING NANOSTRUCTURES

(75) Inventors: Fahhad H. Alharbi, Riyadh (SA); John D. Bass, Union City, CA (US); Ho-Cheol Kim, San Jose, CA (US); Robert D. Miller, San Jose, CA (US)

(73) Assignees: International Business Machines Corporation, Armonk, NY (US); King Abdulaziz City for Science and Technology, Riyadh (SA)

( * ) Notice: Subject to any disclaimer, the term of this patent is extended or adjusted under 35 U.S.C. 154(b) by 83 days.

(21) Appl. No.: 12/974,404

(22) Filed: Dec. 21, 2010

(65) Prior Publication Data

US 2012/0152448 A1 Jun. 21, 2012

(51) Int. Cl.
*B32B 27/00* (2006.01)
*B29C 33/52* (2006.01)

(52) U.S. Cl. ........ 156/245; 156/155; 156/242; 264/308; 264/317

(58) Field of Classification Search .................. 438/759; 264/317
See application file for complete search history.

(56) References Cited

U.S. PATENT DOCUMENTS

| | | | | |
|---|---|---|---|---|
| 3,965,233 A * | 6/1976 | Ritter | ............................ | 264/219 |
| 6,793,831 B1 * | 9/2004 | Paul et al. | ........................ | 216/36 |
| 7,132,309 B2 * | 11/2006 | Sung | ............................. | 438/105 |
| 7,253,017 B1 | 8/2007 | Roscheisen et al. | | |
| 7,511,217 B1 | 3/2009 | Roscheisen et al. | | |
| 7,572,400 B2 | 8/2009 | Fujikawa et al. | | |
| 2002/0076575 A1 * | 6/2002 | Yang et al. | ..................... | 428/689 |
| 2003/0219992 A1 * | 11/2003 | Schaper | ........................ | 438/748 |
| 2005/0210811 A1 * | 9/2005 | Nasvik | ............................. | 52/596 |
| 2005/0218398 A1 * | 10/2005 | Tran | .................................. | 257/14 |
| 2007/0243679 A1 * | 10/2007 | Vecchione et al. | ............ | 438/253 |
| 2007/0264481 A1 | 11/2007 | DeSimone et al. | | |
| 2008/0050564 A1 | 2/2008 | Fujikawa et al. | | |
| 2008/0070010 A1 | 3/2008 | Dravid et al. | | |
| 2009/0133751 A1 | 5/2009 | Sreenivasan et al. | | |
| 2009/0240001 A1 | 9/2009 | Regner | | |
| 2009/0250588 A1 | 10/2009 | Robeson et al. | | |
| 2010/0006211 A1 | 1/2010 | Wolk et al. | | |
| 2010/0206470 A1 * | 8/2010 | Chen et al. | ..................... | 156/245 |

OTHER PUBLICATIONS

Goh, C., K.M. Coakley, and M.D. McGehee, "Nanostructuring Titania by Embossing with Polymer Molds Made from Anodic Alumina Templates", Nano Letters, vol. 5, No. 8, Published Jul. 26, 2005, pp. 1545-1549.*

C. Peng et al., "Hybrid mold reversal imprint for three-dimensional and selective patterning", J. Vac. Sci. Technol. B vol. 24, No. 6, Nov./Dec. 2006, pp. 2968-2972.

Christian Marzolin et al., "Fabrication of Glass Microstructures by Micro-Molding of Sol-Gel Precursors", Advanced Materials, vol. 10, No. 8, 1998, pp. 571-574.

(Continued)

*Primary Examiner* — William Bell
(74) *Attorney, Agent, or Firm* — Daniel E. Johnson

(57) ABSTRACT

Layered nanostructures are constructed by imprinting material with a mold, while selectively modifying and removing a portion of the mold. The mold, which includes a pattern of features, is modified so that the portion of the mold that includes the features is made chemically and/or physically distinct from the rest of the mold. That portion of the mold that includes the features is retained while the rest of the mold is removed. The retained portion of the mold provides mechanical support for any adjoining layer or layers.

29 Claims, 10 Drawing Sheets

Formation of
Layered Nanostructure

OTHER PUBLICATIONS

Yong Joo Kim et al., "Syntheses of monodispersed SnO2 and CeO2 nanoparticles through the self-capping role of 2-ethylhexanoate ligands", New J. Chem., No. 31, 2007 pp. 260-264.

Kang-Soo Han et al., "Fabrication of complex nanoscale structures on various substrates", Appl. Phys. Lett. 91, 2007, pp. 123118-1-123118-3.

Meredith J. Hampton et al., "The Patterning of Sub-500 nm Inorganic Oxide Structures", Advanced Materials, No. 20, 2008, pp. 2667-2673.

L.-R. Bao et al., "Nanoimprinting over topography and multilayer three-dimensional printing", J. Vac. Sci. Technol. B, vol. 20, No. 6, Nov./Dec. 2002, pp. 2881-2886.

* cited by examiner

Formation of First Intermediate Structure

Formation of Second Intermediate Structure

Formation of
Layered Nanostructure

METHOD OF FORMING NANOSTRUCTURES

TECHNICAL FIELD

The invention is directed to methods of forming layered nanostructures.

BACKGROUND

Nanoscopic structures are of growing interest and have enabled the production of new materials in photonics, microfluidics, and other disciplines. One method for forming nanoscopic structures is transfer molding, which has emerged as an attractive way to produce low cost, large area patterns. (See, for example, Marzolin et al., Advanced Materials, vol. 10, pp. 571-574, 1998; and Hampton et al., Advanced Materials, vol. 20, pp. 2667-2673, 2008.) Transfer molding has the potential for high throughput while avoiding the intensive processing associated with traditional patterning methods such as lithography.

Transfer molding has been employed to form layered structures by hot bonding successive layers of polymeric materials at temperatures above the glass transition temperature $T_g$ of the last-deposited layer. (See, for example, Bao et al., J. Vac. Sci. Technol. B, vol. 20, pp. 2881-2886, 2002.) Also, layers have been successively stacked by including gluing steps in the fabrication process. (See, for example, Han et al., Applied Physics Letters, vol. 91, pp. 123118-123113, 2007.) Nevertheless, the prior art techniques suffer from various limitations, so that while transfer molding has met with some success, its extension to layered, patterned materials remains a challenge.

SUMMARY

The present invention circumvents problems encountered in the prior art, e.g., when introducing glue is undesirable or impractical, or when the Tg of a polymeric material (that is to be applied to an existing layer) is greater than that of the polymeric material of an existing layer. Methods are disclosed herein in which only part of a mold is initially removed while leaving in place the rest of the mold (including the mold's pattern of features). Material that has been applied to the mold takes on the (inverse of) the mold's pattern. The process can be repeated with additional molds and material(s), with all the molds finally being completely removed, thereby leaving only layers of material having patterns determined by the molds. The methods herein resist draining, sagging, wetting, or infill by subsequently applied layers or molds. Preferred methods are low cost, scalable, environmentally benign, and do not require vacuum or an imprinting machine. High fidelity sub-750 nm resolution is possible (as well as sub-200 nm, sub-135 nm, and sub-50 nm resolution), involving stacks of layers having varying periodicity, composition, and thickness. A broad class of materials may be advantageously used as the mold materials.

In preferred implementations of the invention, material is applied to a mold, with the mold being modified in some way so that the portion of the mold that includes a pattern of features is made chemically and/or physically distinct from the rest of the mold. This allows retention of that portion of the mold that includes the pattern while the rest of the mold is removed. The remaining portion of the mold can be removed after subsequent processing. The material that has been applied to the mold is patterned as a result of being in contact with the mold. The patterned material is thus protected by the remaining portion of the mold, thereby preserving the fidelity of the pattern that has been transferred into the material: This aspect of the preferred implementations is advantageous in that it 1) helps prevent leakage of material from any subsequently applied layers into layers that have already been formed, 2) allows the use of layers that are not fully cured, and 3) allows gluing and hot bonding steps to be avoided.

The mold may be heterogeneously modified through one of a variety of techniques, e.g., if the material that is applied to the mold is a solution, species in that solution may diffuse into the mold and induce localized cross linking The cross-linked material will be more resistant to chemical dissolution than the remaining portion of the mold, but the cross-linked material can be later removed through another process (e.g., calcination) when generating the desired nanostructure.

One aspect of the invention is a method that includes applying a first material to a first mold, in which the first material conforms to a shape of the first mold and thereby acquires a first pattern determined by the shape of the first mold, with the first material and the first mold together forming a first temporary structure. The first temporary structure is joined to a substrate. A portion of the first mold is modified, with the first mold becoming heterogeneous with respect to at least one of a chemical and/or physical property, so that the first mold includes first and second portions. (This modifying step may be performed before the applying step.) One of the first and second portions of the first mold is removed, thereby forming a first intermediate structure that includes i) the substrate, ii) an un-removed portion of the first mold, and iii) the first material or a derivative of the first material. The first material itself may act as the agent that modifies a portion of the first mold, so that the first mold becomes heterogeneous.

The method may further include applying a second material to a second mold, in which the second material conforms to a shape of the second mold and thereby acquires a second pattern determined by the shape of the second mold, so that the second material and the second mold together form a second temporary structure. The second temporary structure is joined to the first intermediate structure. A portion of the second mold is modified, with the second mold becoming heterogeneous with respect to at least one of a chemical and/or physical property, so that the second mold includes first and second portions. One of the first and second portions of the second mold is removed, thereby forming a second intermediate structure that includes i) an un-removed portion of the second mold, ii) the second material or a derivative of the second material, and iii) the first intermediate structure.

The method may further include removing any remaining portions of the first and second molds, thereby leaving a layered structure that includes i) the substrate, ii) the first material or a derivative of the first material, and iii) the second material or a derivative of the second material. Additional layers in contact with the layered structure may be formed.

Another aspect of the invention is a method that includes imprinting a first material with a first mold, removing only a portion of the first mold, imprinting a second material with a second mold, and removing at least a portion of the second mold. A structure is formed that includes i) the first material or a derivative of the first material, ii) the second material or a derivative of the first material, iii) a remaining portion of the first mold, and optionally iv) a remaining portion of the second mold. (Prior to the forming step, the second mold may be removed in its entirety, so that the structure consists essentially of i) the first material or a derivative of the first material, ii) the second material or a derivative of the second material, and iii) a remaining portion of the first mold.) A remaining portion of the first mold and any remaining portion of the second mold are removed, thereby resulting in joining together i) the first material or its derivative and ii) the second material or its derivative to yield a layered structure. The method preferably includes joining both a) the first mold and b) the first material or a derivative of the first material to a substrate.

In preferred methods herein, the first and/or second material may include a precursor in a solution, a polymerizable polymer, a sol-gel that undergoes polymerization, or a solvent and nanoparticles (in which the nanoparticles form a solid upon removal of the solvent).

BRIEF DESCRIPTION OF THE DRAWINGS

FIG. 1 includes FIGS. 1A, 1B, and 1C, in which:

FIG. 2, which includes

FIG. 3, which includes

FIG. 4 includes FIGS. 4A and 4B, in which:

FIG. 5 includes SEM micrographs of two-layer structures prepared from the same mold but using different concentrations of fill solution:

DETAILED DESCRIPTION

Figure 1A:
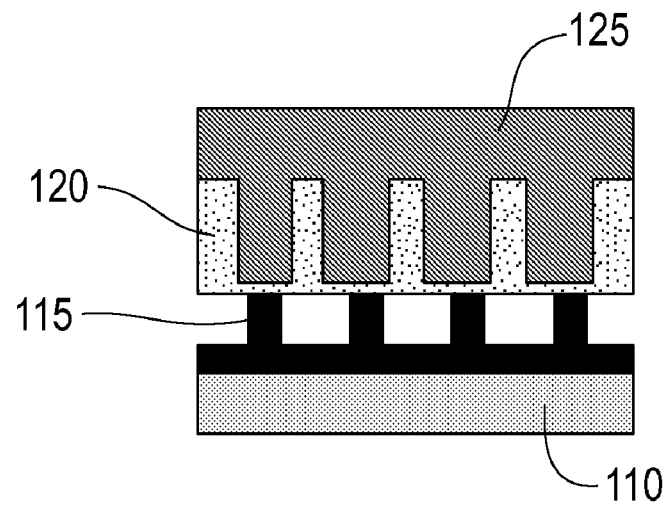
FIG. 1A illustrates an idealized molding process when material is patterned onto an existing molded layer.

The formation of multilayered structures involving soft materials typically suffers from the tendency of the overlayers to deform as a result of the layer(s) below them. FIG. 1 illustrates some of the relevant processes for a layer being molded onto a pre-existing first layer. FIG. 1A shows an idealized process, in which a substrate 110 supports a first molded structure 115. A material 120 that is to be molded is placed in and around a mold 125. In this idealized case, both the material 120 and the mold 125 demonstrate structural integrity, permitting layers to be built up on the underlying substrate 110 and the molded structure 115.

Figure 1B:
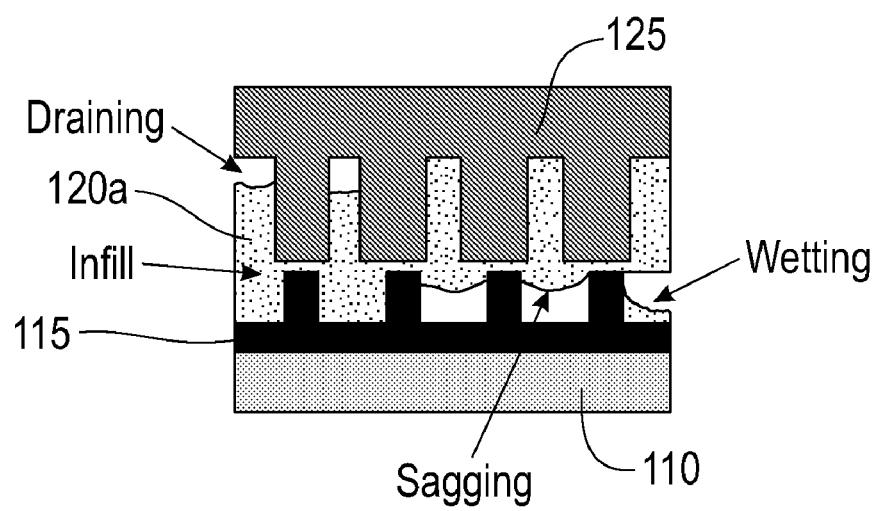
FIG. 1B shows an undesirable result when the material to be molded is deformable to the point of lacking structural integrity.
Figure 1C:
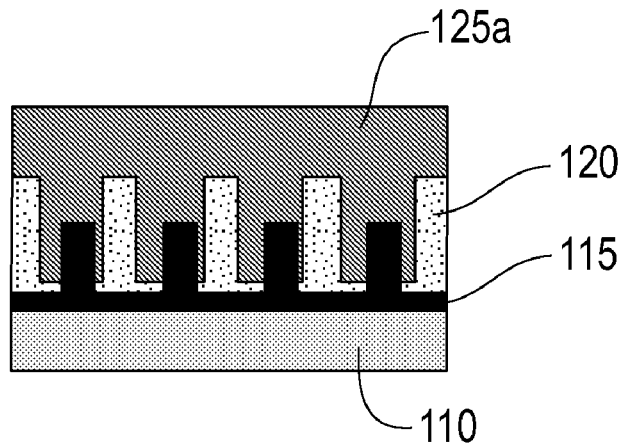
FIG. 1C shows an undesirable result when the mold itself is deformable.

In the more realistic scenario shown in FIG. 1B, a material 120a that is to be molded lacks structural integrity and actually pulls away from the mold 125. As shown in FIG. 1B, this leads to several undesirable phenomena, such as draining, infilling, sagging, and wetting. (See, for example, Peng et. al., "Hybrid mold reversal imprint for three-dimensional and selective patterning" Journal of Vacuum Science Technology B, vol. 24, pp. 2968-2972, 2006.) In another commonly encountered scenario (shown in FIG. 1C), the material 120 enjoys structural integrity, but a mold 125a around which it is placed actually deforms. This can occur if the mold 125a is soft relative to the forces it experiences during molding. The result is vertical mixing of the molded layers. (See, for example, Hampton et. al., "The Patterning of Sub-500 nm Inorganic Oxide Structures", Advanced Materials, vol. 20, pp. 2667-2673, 2008.) In practice, both of the issues shown in FIGS. 1B and 1C are a problem, and it has proven difficult to build up reliable nanostructures using previously known techniques.

Figure 2A:
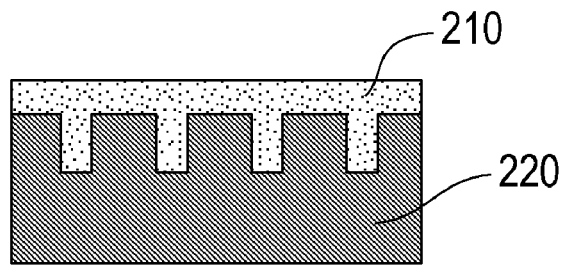
FIGS. 2A, 2B, 2C, 2D, 2E, 2F, 2G, 2H, 2I, 2J, and 2K, illustrates a series of steps of a preferred implementation of the invention, leading to the formation of a layered nanostructure.
Figure 2B:
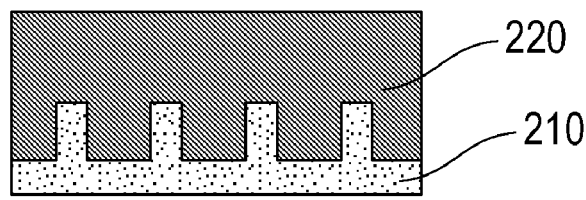
Figure 2C:
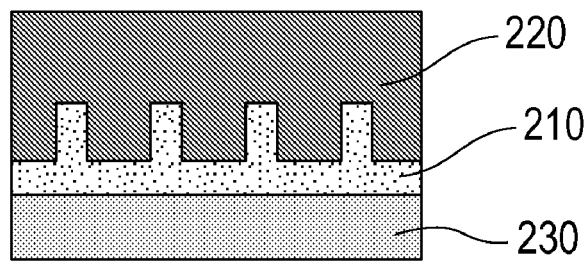

Methods are disclosed herein that avoid the occurrence of such undesirable processes, while maintaining the fidelity of molded layers. A preferred implementation of the invention is now described with respect to FIG. 2. As shown in FIG. 2A, a first material 210, which may be a precursor to another material, is coated or otherwise applied onto a first mold 220 having various features therein constituting a pattern to be transferred to the first material 210. The first material 210 and the first mold 220 are inverted if need be (see FIG. 2B) and then laminated or otherwise joined (e.g., by pressing them together at elevated temperatures) to a first substrate 230 (see FIG. 2C), thereby forming a first temporary structure that is to undergo further processing. (While use of the substrate 230 is highly desirable, its use may be avoided provided that the first material 210 and the first mold 220 have sufficient structural integrity, e.g., they are sufficiently thick and rugged that they can withstand subsequent processing.)

Figure 2D:
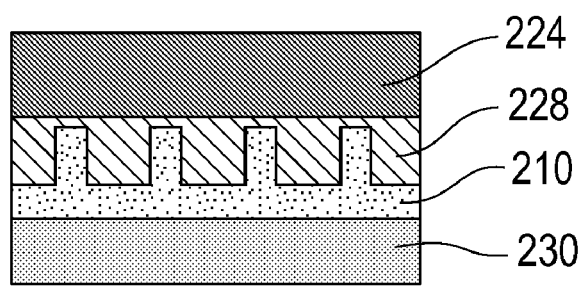

As shown in FIG. 2D, the first mold 220 undergoes selective modification, which results in a first portion 224 and a second portion 228 of the first mold 220 that are heterogeneous with respect to their chemical and/or physical properties. This facilitates removal of the first portion 224 (e.g., it may be preferentially dissolved away with a solvent), thereby forming a first intermediate structure 240 (see FIG. 2E), which can be used as a platform for the formation of one or more additional layers. In structure 240, the second portion 228 (which may now be a derivative of the first material 210 if that material has undergone a chemical or physical transformation) fills space that will eventually be emptied, but until then that space is filled with material that provides mechanical support for one or more additional layers, while mitigating the unwanted phenomena described above in connection with FIG. 1B. The second portion 228 includes an uppermost portion or layer (designated in FIG. 2E as 229) which may be removed as desired, e.g., through an etching process, so that the first material 210 is exposed directly to air or the surrounding environment.

The methodology may be repeated to build an additional layer or layers over the first intermediate structure 240, thereby forming a layered nanostructure. As shown in FIG. 2F, a second material 250 (which may be a precursor to another material; note that the first material 210 and the second material 250 may be the same kind of material) is coated or otherwise applied onto a second mold 260 having various features therein constituting a pattern to be transferred to the second material 250. The second material 250 and the second mold 260 are inverted if need be (see FIG. 2G) and then laminated or otherwise joined to the first intermediate structure 240 (see FIG. 2H), thereby forming a second temporary structure that is to undergo further processing.

Figure 2E:
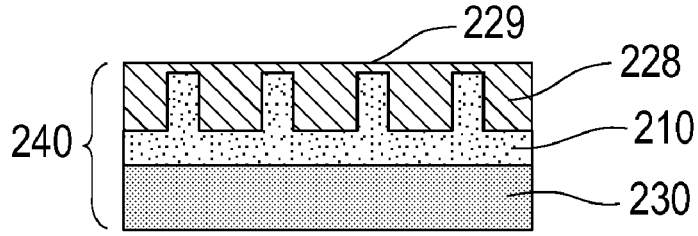
Figure 2F:
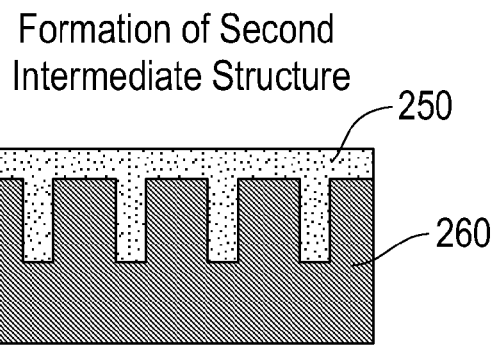
Figure 2G:
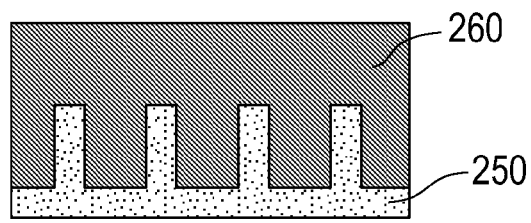
Figure 2H:
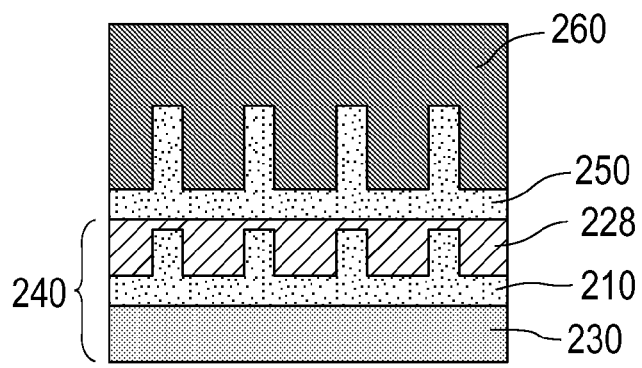
Figure 2I:
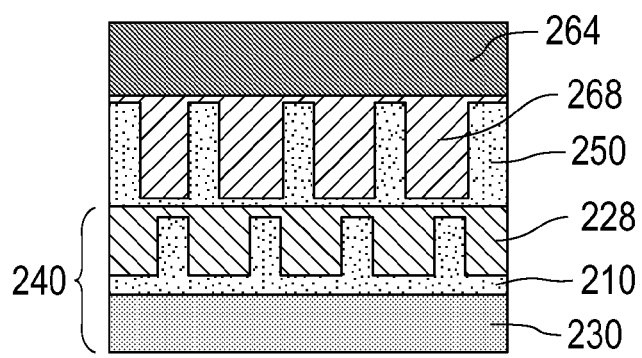

As shown in FIG. 2I, the second mold 260 then undergoes selective modification, which results in a first portion 264 and a second portion 268 that are heterogeneous with respect to their chemical and/or physical properties. This facilitates removal of the first portion 264 (e.g., it may be preferentially dissolved away), thereby forming a second intermediate structure 270 (see FIG. 2J), which may likewise be used as a platform for the formation of additional layers.

In structure 270 (as was the case with structure 240), the second portion 268 (which may now be a derivative of the second material 250 if that material has undergone a transformation) fills space that will eventually be emptied, but until then that space is filled with material that can provide mechanical support for any additional layer or layers. Also, the second portion 268 includes an uppermost portion or layer that may be removed as desired, e.g., through an etching process, so that the second material 250 is exposed directly to air or the surrounding environment.

Figure 2J:
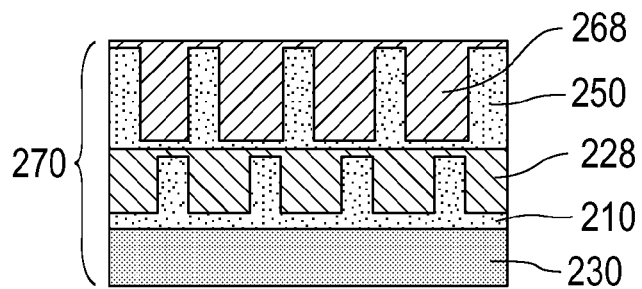
Figure 2K:
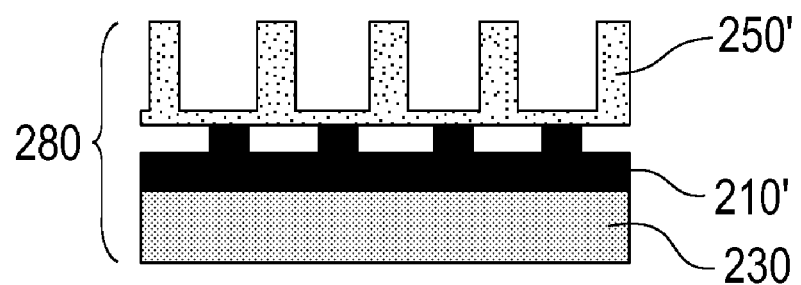

If need be, the second intermediate structure 270 may be cured through heating or other means, and any remaining portions of the first and second molds (e.g., the second portion 228 of the first mold 220, and the second portion 268 of the second mold 260) may be removed to form a nanostructure 280 that includes the substrate 230 and the cured derivatives 210' and 250' of the first and second materials 210 and 250 (see FIG. 2K). Curing may be required, for example, if the first and second materials 210 and 250 include certain kinds of polymers, e.g., low-molecular weight polymers that need to undergo crosslinking Also, solubilized polymers that solidify after drying out or sol-gel materials that gradually solidify throughout the course of the method may be used. In general, the first and/or second materials 210 and 250 may alter their properties as the method is carried out, and further, even the shapes of these materials may change slightly if they are cured (which could then alter their respective patterns). On the other hand, for certain choices of materials 210 and 250, no curing step may be required. For example, one or both of the first material 210 and the second material 250 may include nanoparticles (e.g., a colloid that includes a solvent and nanoparticles such as $SnO_2$), with the solvent evaporating at some point, leaving behind just the nanoparticles as a solid.

As an alternative (not shown) to the process steps illustrated in FIGS. 2I and 2J, the second mold 260 may be removed entirely after the second temporary structure shown in FIG. 2H is formed, provided that the remaining components have sufficient structural integrity to withstand any further processing that is required. Any remaining portion of the first mold (e.g., the second portion 228 of the first mold 220) may then be removed to form the nanostructure 280 shown in FIG. 2K.

The nanostructure 280 of FIG. 2K shows the cured first material 210' and the cured second material 250' in contact with each other, although the first material 210 and the second material 250 of FIG. 2J are not in direct contact. Direct contact between the cured first material 210' and the cured second material 250' may be achieved spontaneously as a result of the curing process, or an optional etch step may be employed to remove any material between them, thereby bringing these materials into contact with each other.

Excess material may exist between the first and second materials 210 and 250 (or their cured derivatives) if the volume of the second material 250 exceeds the volume within the second mold 260. Controlling the amount of the second material 250 that is used can determine whether the resulting structure is a closed-cell structure (as shown in FIG. 2K) or an open-cell structure. Also, additional layers may be formed over the nanostructure 280 using steps analogous to those outlined above. Accordingly, a variety of structures can be formed including ones of varying periodicity, composition, and thickness.

Figure 3A:
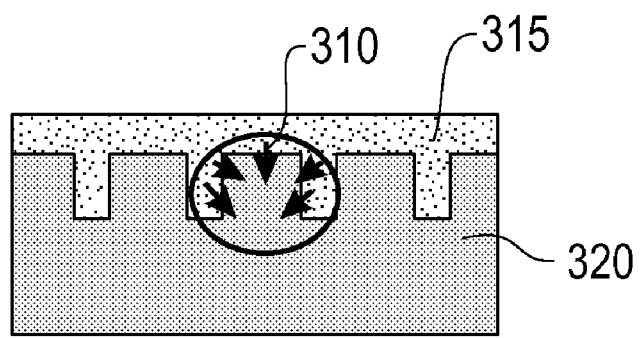
FIGS. 3A and 3B, illustrates how one or more chemical agents in a solution can penetrate a mold and induce localized crosslinking around features in the mold, thereby rendering the mold heterogeneous.
Figure 3B:
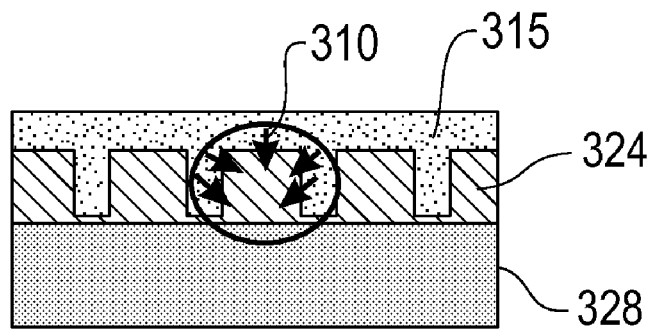

As discussed above, the first mold 220 and the second mold 260 are rendered heterogeneous with respect to their chemical and/or physical properties, thereby facilitating removal of a portion of the mold. A preferred way of accomplishing this is to employ a process that only modifies that portion of the mold immediately surrounding the features that define the mold's pattern. To this end, a diffusion based process (e.g., chemical, thermal, etc.) or exposure to strongly absorbed radiation (e.g., UV light) or particles (e.g., electrons) can be employed to induce crosslinking This is illustrated in FIG. 3A, in which one or more chemical agents 310 within an applied solution 315 diffuse into a mold 320. FIG. 3B illustrates that crosslinking occurs in a portion 324 of the mold 320 while leaving a portion 328 of the mold 320 substantially unaffected. The mold 320 is thereby rendered heterogeneous with respect to its chemical and/or physical properties.

EXAMPLES

The following examples are intended to provide those of ordinary skill in the art with a complete disclosure and description of how to use the methods claimed herein. An effort has been made to ensure accuracy with respect to measured numbers, but allowance should be made for the possibility of errors and deviations. Unless indicated otherwise, parts are parts by weight, temperature is in ° C., and pressure is at or near atmospheric. All chemicals and materials were obtained commercially or were synthesized using known procedures. Commercially available PVA molds were purchased from TDI (Transfer Devices, Inc) of San Jose, Calif. SEM was performed on a Hitachi S-4700 at 3 kV.

Example 1 employs a structure (see FIG. 4A) that is analogous to the structure shown in FIG. 2E. Examples 2-4 result in multi-layered structures, similar to the structure shown in FIG. 2K. In FIGS. 5-9, the various layers are numbered for clarity (1, 2, 3, 4, and 5, as is the case).

Example 1

Single-Layer Titania Structure

Figure 4A:
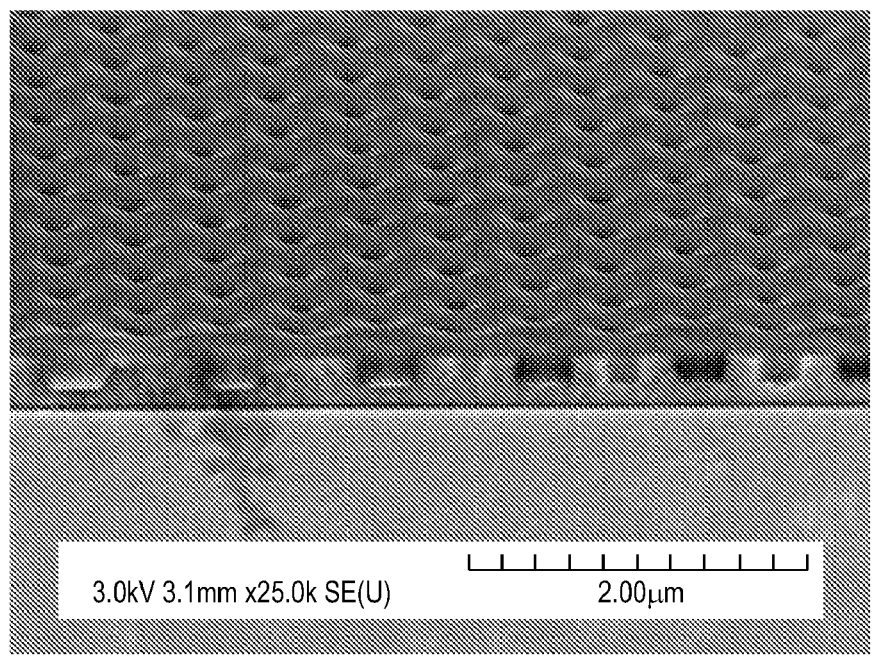
FIG. 4A is a scanning electron microscope (SEM) micrograph of crosslinked polyvinyl alcohol (PVA) within and around a molded titania structure, taken just after dissolution of a portion of the PVA mold.
Figure 4B:
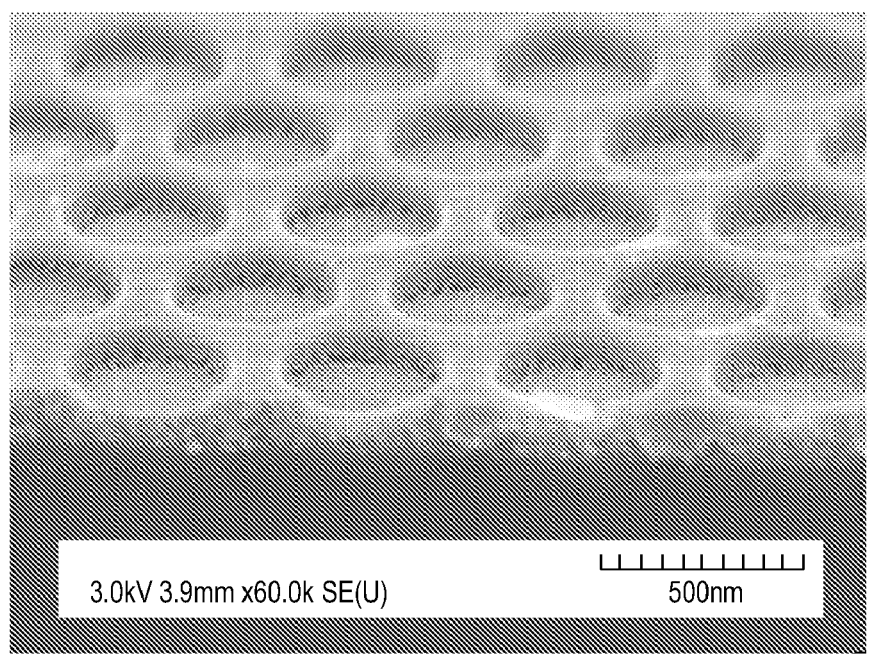
FIG. 4B illustrates how calcination removes the remaining portion of the PVA mold to reveal more clearly the underlying titania pattern.

A 30 wt. % titania precursor (consisting of Dupont™ Tyzor® BTP and acetylacetone (1:1 mol Ti:mol acetylacetone) in propylene glycol propyl ether (PGPE)) was applied to a PVA mold. (This solution rendered the PVA mold heterogeneous around its nanoscale-patterned regions, which led to localized cross linking near those regions; the corresponding cross-linked portions of the PVA mold were resistant to dissolution.) The temporary structure that included the PVA mold and an imprinted derivative of the titania precursor solution (the solvent in the solution evaporated and some polymerization of the precursor occurred) was heated to 80° C. for 10 s and then joined to a silicon substrate that had been pre-heated to 80° C. After an additional 10 s, the resulting structure (PVA mold, imprinted derivative and substrate) was removed from the heat source and exposed to short wavelength UV radiation (λ=245 nm) at room temperature for 20 to 30 min. A portion of the PVA mold was then dissolved by immersion in warm deionized water. The corresponding structure is shown in FIG. 4A, which shows the substrate (bottom), the imprinted derivative of the titania precursor solution (middle), and the remaining portion of the PVA mold (top). As shown in FIG. 4B, removing the crosslinked portion of the PVA mold through calcination at 450° C. in air revealed the corresponding patterned titania structure (on top of the substrate).

Example 2

Stacked Titania Structure from 250 nm (Diameter) Mesh Mold

Two-layer titania structures were fabricated in both closed-cell (analogous to FIG. 2K) and open-cell morphologies. A titania precursor solution consisting of Dupont™ Tyzor® BTP and acetylacetone (1:1 mol Ti:mol acetylacetone) was diluted at varying concentrations in PGPE. A closed-cell structure was prepared by spin coating a 30 wt % precursor solution onto a 250 nm (diameter) mesh PVA mold at 2000 rpm for 45 s. (This solution rendered the PVA mold heterogeneous around its nanoscale-patterned regions, which led to localized cross linking near those regions; the corresponding cross-linked portions of the PVA mold were resistant to dissolution.) The resulting sample was heated to 80° C. for 10 s before placing it onto a bare silicon wafer substrate (that had been pre-heated to 80° C.), which joined the sample to the substrate, thereby forming a temporary structure analogous to that shown in FIG. 2C. After an additional 10 s, the temporary structure was removed from the heat source and exposed to short wavelength UV radiation (λ=245 nm) at room temperature for 20 to 30 min. Dissolution of the non-crosslinked portion of the PVA mold was carried out at 42° C. (aqueous, pH 2.2) for 15 min. The resulting intermediate structure (analogous to that shown in FIG. 2E), which included titania, was then dried with ethanol and hexane. A second layer was formed using similar procedures. Final calcination to remove the crosslinked portions of the PVA molds around the patterned titania regions was carried out at 450° C. for 2 hrs in air (ramp up at 5° C./min), resulting in the structure shown in FIG. 5A (analogous to the structure shown in FIG. 2K).

Figure 5A:
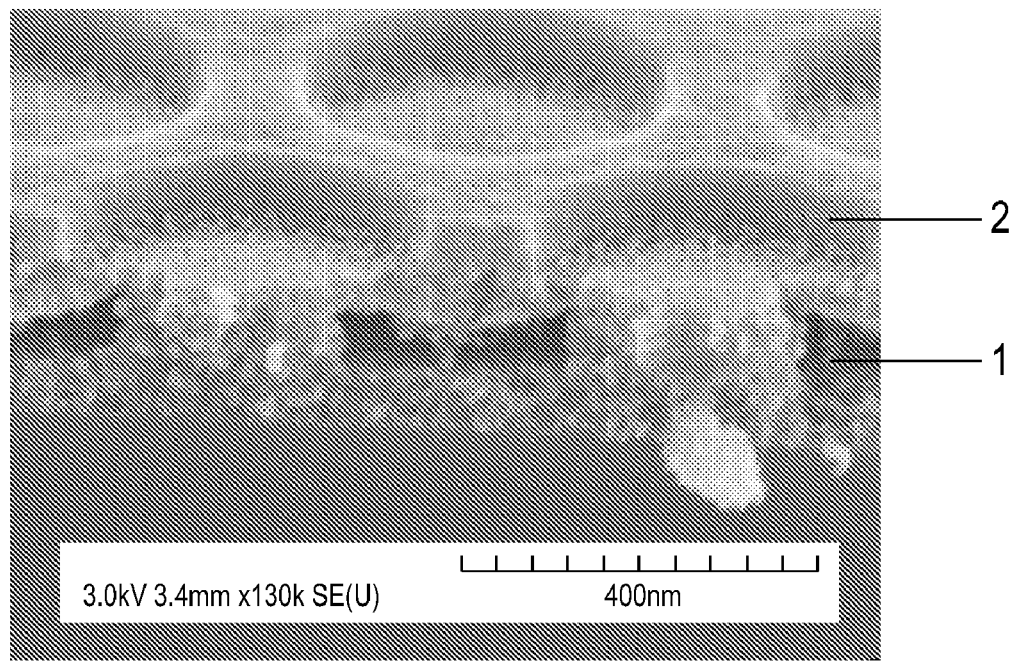
FIG. 5A shows that at higher concentrations of fill solution closed spaces are formed as the amount of fill material is greater than the mold volume.
Figure 5B:
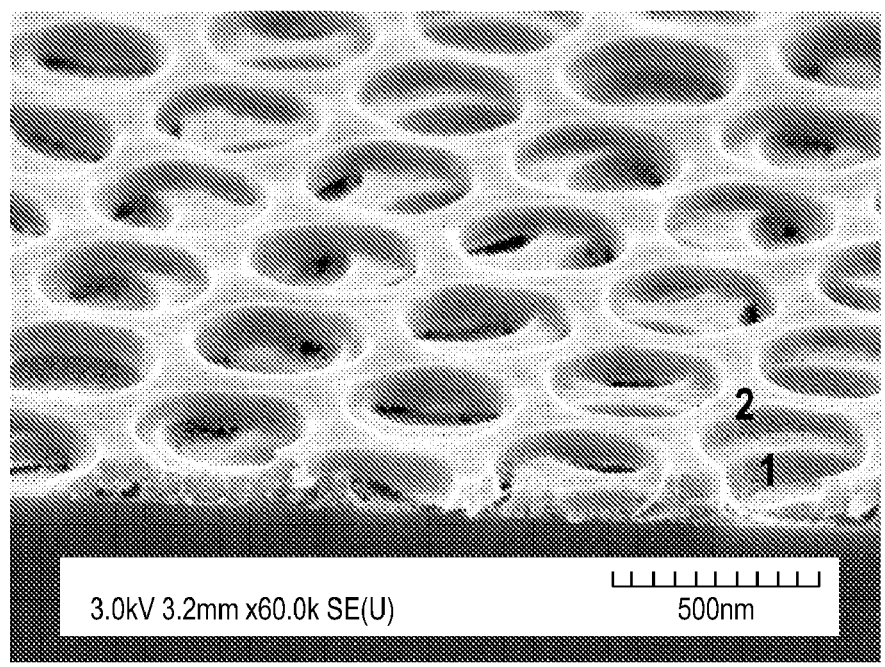
FIG. 5B shows that lower concentrations can be used to form open structures.
Figure 6:
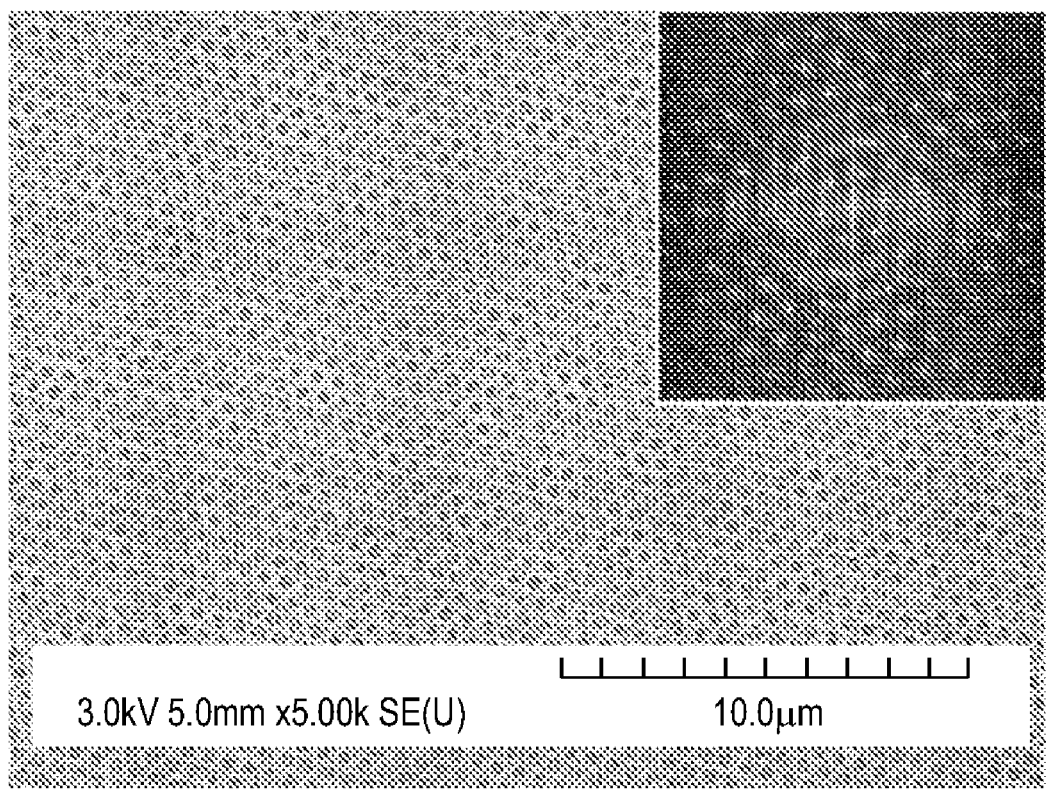
FIG. 6 is an SEM micrograph of an open two-layer structure having a pronounced moiré pattern and excellent periodicity (as shown by the inset generated by fast Fourier transform from the image in the micrograph).
Figure 7:
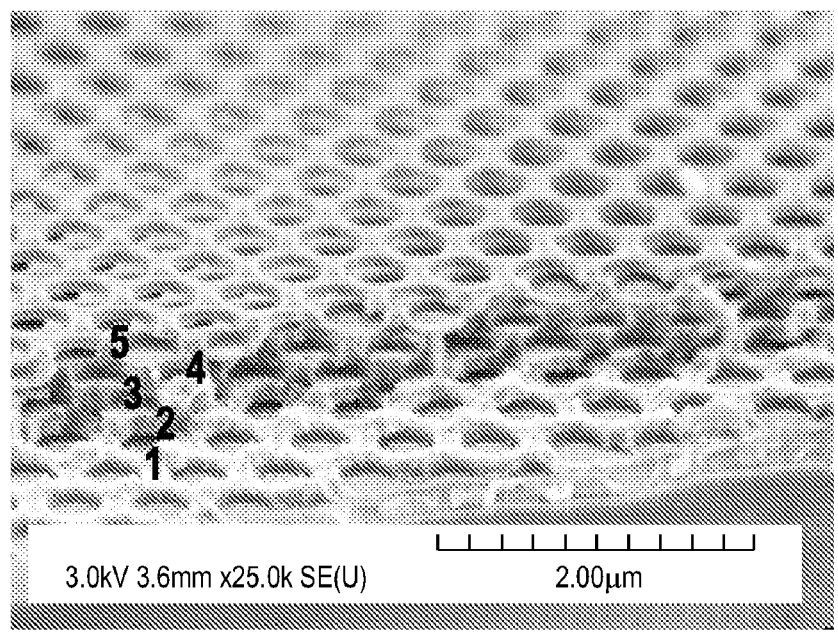
FIG. 7 is a cross-section SEM micrograph of a five-layer material, with each of the 5 layers having been prepared from the same 250 nm (diameter) mesh mold.

An open-cell two-layer structure was fabricated by employing similar procedures but using a 15 wt % precursor solution (see FIG. 5B). A top view SEM micrograph of this open-cell two-layer structure showed a pronounced moiré pattern and excellent periodicity over large areas (see FIG. 6). These procedures were extended to form the structure shown in FIG. 7, which has more than two layers.

Example 3

Stacked Two Layer Titania Structure from Two Different Molds

Figure 8:
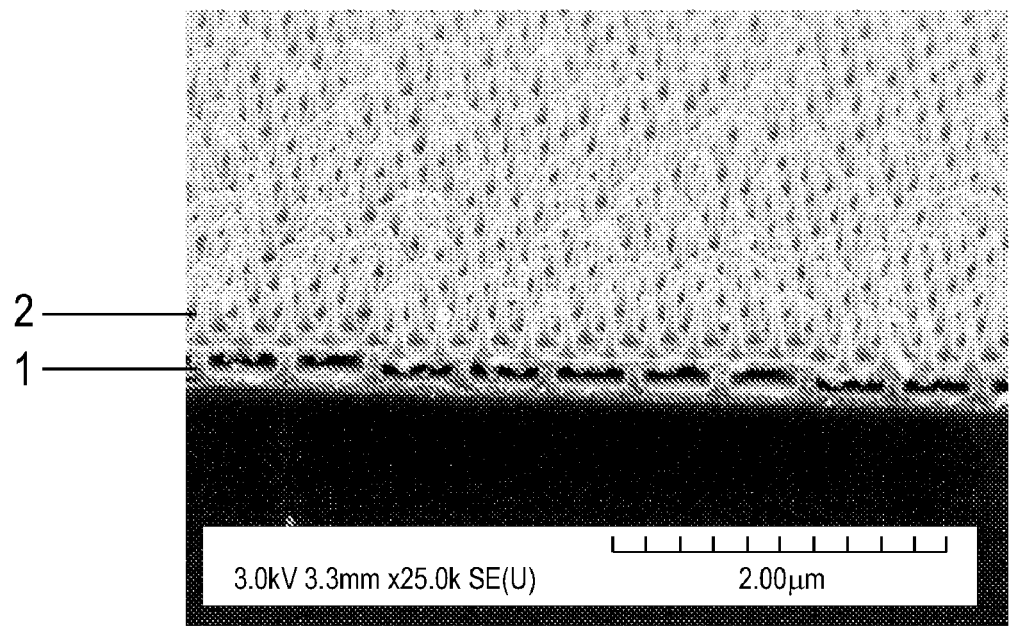
FIG. 8 is a cross-section SEM micrograph of a two-layer closed-cell structure prepared using 2 different molds, a 250 nm (diameter) mesh and a 135×750 nm (diameter×depth) post structure.

Closed-cell two-layer titania structures fabricated with two different molds are shown in FIG. 8. A 30 wt % titania precursor solution consisting of Dupont™ Tyzor® BTP and acetylacetone (1:1 mol Ti:mol acetylacetone) in PGPE was used to form the first layer using a 250 nm (diameter) mesh PVA mold, following the procedures outlined in Example 2. The second layer was formed using a mold having holes whose approximate dimensions were 135×750 nm (diameter×depth), with 5 volume % acetic acid now being added to the precursor solution to facilitate the templating process. Other conditions and final calcination were performed as above in Example 2.

Example 4

Figure 9:
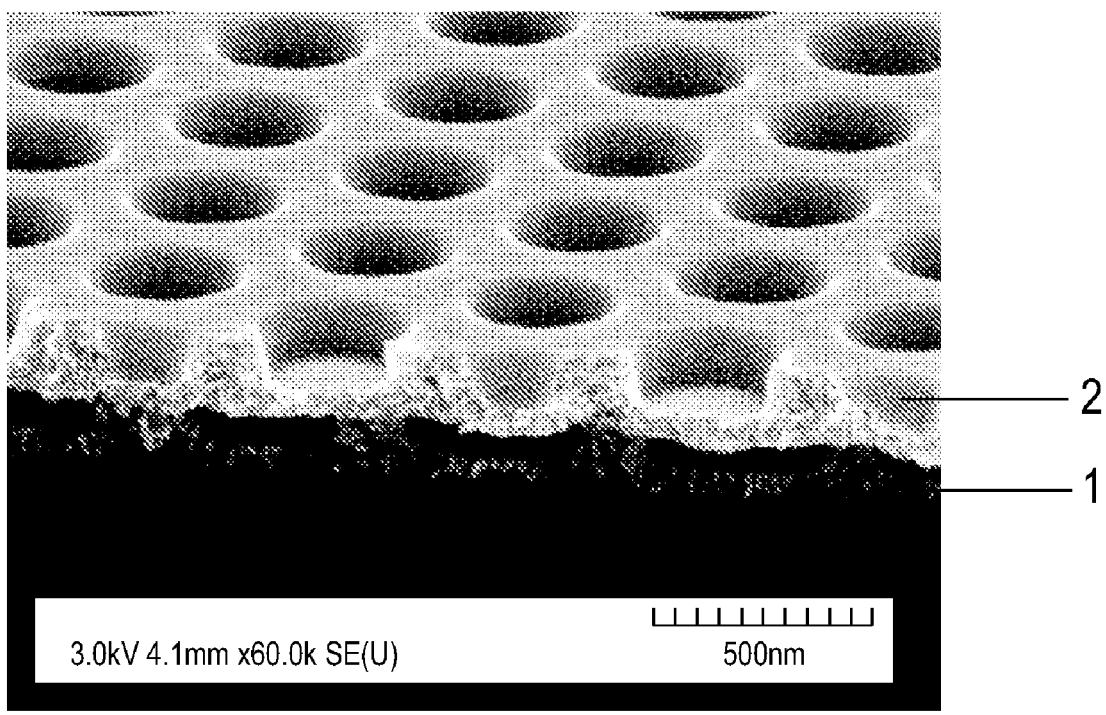
FIG. 9 is a cross-section SEM micrograph of a two-layer closed-cell structure having a bottom layer of patterned titania and a top layer of patterned tin oxide.

Stacked Two Layer Structure with a Bottom Titania Layer and a Top Tin Oxide Layer Closed-cell two-layer structures fabricated with two different materials are shown in FIG. 9. A 30 wt % titania precursor solution consisting of Dupont™ Tyzor® BTP and acetylacetone (1:1 mol Ti:mol acetylacetone) in PGPE was used to form the first layer using a 250 nm (diameter) mesh PVA mold, following the procedures outlined in Example 2. A tin oxide second layer was formed from a mold (having the same pattern as the first mold) using a 20 wt % solution in toluene of 2-ethylhexanoate-capped tin oxide nanoparticles synthesized according to literature procedures. (See Kim et al., New Journal of Chemistry, vol. 31, pp. 260-264, 2007.) Other conditions and final calcination were performed as above in Example 2.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

The invention claimed is:

1. A method, comprising:
    applying a first material to a first mold, the first material conforming to a shape of the first mold and thereby acquiring a first pattern determined by various features in the first mold that include features having a characteristic dimension less than 750 nm, the first material and the first mold together forming a first temporary structure;
    joining the first temporary structure to a substrate, thereby forming an integral unit;
    modifying a portion of the first mold, so that the first mold becomes heterogeneous with respect to at least one of a chemical and/or physical property, the first mold thereby including a first portion corresponding to the modified portion and an unmodified, second portion; and
    removing one of said first and second portions of the first mold, thereby forming a first intermediate structure that includes i) the substrate, ii) an un-removed portion of the first mold, the un-removed portion including said shape of the first mold, and iii) the first material (or a derivative of the first material) having the first pattern and being located between the substrate and the un-removed portion of the first mold.

2. The method of claim 1, wherein said modifying step is performed before said applying step.

3. The method of claim 1, wherein the first material modifies the first mold, so that the first mold becomes heterogeneous, thereby forming the first and the second portions.

4. The method of claim 1, further comprising:
    applying a second material to a second mold, the second material conforming to a shape of the second mold and thereby acquiring a second pattern determined by the shape of the second mold, the second material and the second mold together forming a second temporary structure;

joining the second temporary structure to the first intermediate structure;

modifying a portion of the second mold, so that the second mold becomes heterogeneous with respect to at least one of a chemical and/or physical property, the second mold thereby including a first portion corresponding to the modified portion and an unmodified, second portion; and removing one of said first and second portions of the second mold, thereby forming a second intermediate structure that includes i) an un-removed portion of the second mold, the un-removed portion of the second mold including said shape of the second mold, ii) the second material (or a derivative of the second material) having the second pattern, and iii) the first intermediate structure.

5. The method of claim 4, comprising:

removing any remaining portions of the first and second molds, thereby leaving a layered structure that includes i) the substrate, ii) the first material or a derivative of the first material, and iii) the second material or a derivative of the second material.

6. The method of claim 5, wherein the layered structure includes elements having shapes determined by the first and second patterns.

7. The method of claim 5, comprising curing the first and second materials.

8. The method of claim 5, further comprising forming additional layers in contact with the layered structure.

9. The method of claim 5, wherein the first mold and the second mold each include features having a characteristic dimension that is less than 750 nm.

10. The method of claim 1, wherein the first material includes a precursor in a solution.

11. The method of claim 1, wherein the first material is a sol-gel that undergoes polymerization.

12. The method of claim 1, wherein the first material includes a solvent and nanoparticles, the nanoparticles forming a solid upon removal of the solvent.

13. The method of claim 1, further comprising:

applying a second material to a second mold, the second material conforming to a shape of the second mold and thereby acquiring a second pattern determined by the shape of the second mold, the second material and the second mold together forming a second temporary structure;

joining the second temporary structure to the first intermediate structure; and removing the second mold, thereby forming a structure that includes i) the second material (or a derivative of the second material) having the second pattern and ii) the first intermediate structure.

14. The method of claim 13, comprising:

removing any remaining portion of the first mold, thereby leaving a layered structure that includes i) the substrate, ii) the first material (or a derivative of the first material) having the first pattern, and iii) the second material (or a derivative of the second material) having the second pattern.

15. The method of claim 14, wherein the layered structure includes elements having shapes determined by the first and second patterns.

16. The method of claim 14, comprising curing the first and second materials.

17. The method of claim 14, further comprising forming additional layers in contact with the layered structure.

18. A method, comprising:

imprinting a first material with a first mold, so that the first material has a first pattern therein;

removing only a portion of the first mold;

imprinting a second material with a second mold, so that the second material has a second pattern therein;

removing at least a portion of the second mold;

forming a structure that includes i) the first material or a derivative of the first material, ii) the second material or a derivative of the second material, iii) a remaining portion of the first mold, the remaining portion having a shape corresponding to the first pattern, and optionally iv) a remaining portion of the second mold;

removing the remaining portion of the first mold and any remaining portion of the second mold, thereby forming a layered structure in which the first material (or its derivative) having the first pattern therein is integrally joined to the second material (or its derivative) having the second pattern therein.

19. The method of claim 18, wherein both a) the first mold and b) the first material or a derivative of the first material are integrally joined to a substrate.

20. The method of claim 18, wherein the first mold and the second mold each include features having a characteristic dimension that is less than 750 nm.

21. The method of claim 18, comprising:

prior to said forming step, removing the second mold in its entirety, so that said structure consists essentially of i) the first material or a derivative of the first material, ii) the second material or a derivative of the first material, and iii) a remaining portion of the first mold.

22. The method of claim 21, wherein:

both a) the first mold and b) the first material or a derivative of the first material are integrally joined to a substrate; and the first mold and the second mold each include features having a characteristic dimension that is less than 750 nm.

23. The method of claim 18, wherein the first material includes a precursor in a solution.

24. The method of claim 18, wherein the first material is a sol-gel that undergoes polymerization.

25. The method of claim 18, wherein the first material includes a solvent and nanoparticles, the nanoparticles forming a solid upon removal of the solvent.

26. The method of claim 18, wherein the second material includes a precursor in a solution.

27. The method of claim 18, wherein the second material is a sol-gel that undergoes polymerization.

28. The method of claim 18, wherein the second material includes a solvent and nanoparticles, the nanoparticles forming a solid upon removal of the solvent.

29. The method of claim 18, in which said layered structure is formed as a result of a curing process.

\* \* \* \* \*